United States Patent
Walker et al.

(10) Patent No.: US 7,174,190 B2
(45) Date of Patent: Feb. 6, 2007

(54) SERIAL BUS INTERFACE FOR DIRECT CONVERSION RECEIVER

(75) Inventors: Brett C. Walker, San Diego, CA (US); Paul E. Peterzell, San Diego, CA (US); Tao Li, San Diego, CA (US); Matthew L. Severson, Oceanside, CA (US)

(73) Assignee: Qualcomm Inc., San Diego, CA (US)

( * ) Notice: Subject to any disclaimer, the term of this patent is extended or adjusted under 35 U.S.C. 154(b) by 0 days.

(21) Appl. No.: 11/131,093

(22) Filed: May 16, 2005

(65) Prior Publication Data

US 2005/0208919 A1  Sep. 22, 2005

Related U.S. Application Data

(62) Division of application No. 10/034,734, filed on Dec. 21, 2001, now Pat. No. 7,076,225.

(60) Provisional application No. 60/269,623, filed on Feb. 16, 2001.

(51) Int. Cl.
*H04B 1/38* (2006.01)

(52) U.S. Cl. ............... 455/557; 455/234.2; 455/245.1; 375/346; 375/344

(58) Field of Classification Search .. 455/232.1–251.1, 455/575.1, 425, 456.6, 63.13, 253.2, 161.2, 455/127.1–127.5, 418, 419, 550.1, 561, 424, 455/456.5, 501, 67.11, 63.11, 219, 296, 334, 455/570, 136–138, 556.1–559, 166.2; 375/319, 375/346, 341, 327, 343, 349, 350, 345, 344

See application file for complete search history.

(56) References Cited

U.S. PATENT DOCUMENTS

| | | | | |
|---|---|---|---|---|
| 5,163,164 A | * | 11/1992 | Tults | 455/182.3 |
| 5,808,575 A | * | 9/1998 | Himeno et al. | 341/139 |
| 5,917,865 A | * | 6/1999 | Kopmeiners et al. | 375/345 |
| 6,028,537 A | * | 2/2000 | Suman et al. | 340/988 |
| 6,459,889 B1 | * | 10/2002 | Ruelke | 455/296 |
| 6,498,819 B1 | * | 12/2002 | Martin | 375/345 |
| 6,557,062 B1 | * | 4/2003 | Shaler et al. | 710/110 |
| 6,798,789 B1 | * | 9/2004 | Jackson et al. | 370/489 |

* cited by examiner

*Primary Examiner*—Edward F. Urban
*Assistant Examiner*—Charles Chow
(74) *Attorney, Agent, or Firm*—Philip R Wadsworth; Charles D Brown; George C Pappas

(57) ABSTRACT

A direct downconversion receiver architecture having a DC loop to remove DC offset from the signal components, a digital variable gain amplifier (DVGA) to provide a range of gains, an automatic gain control (AGC) loop to provide gain control for the DVGA and RF/analog circuitry, and a serial bus interface (SBI) unit to provide controls for the RF/analog circuitry via a serial bus. The DVGA may be advantageously designed and located as described herein. The operating mode of the VGA loop may be selected based on the operating mode of the DC loop, since these two loops interact with one another. The duration of time the DC loop is operated in an acquisition mode may be selected to be inversely proportional to the DC loop bandwidth in the acquisition mode. The controls for some or all of the RF/analog circuitry may be provided via the serial bus.

3 Claims, 7 Drawing Sheets

SERIAL BUS INTERFACE FOR DIRECT CONVERSION RECEIVER

This application is a divisional of application Ser. No. 10/034,734, filed Dec. 21, 2001, now U.S. Pat. No. 7,076,225 entitled "VARIABLE GAIN SELECTION IN DIRECT CONVERSION RECEIVER," which application claims the benefit of provisional U.S. application Ser. No. 60/269,623, entitled "Automatic Gain Control for Direct Conversion RF Architecture," filed Feb. 16, 2001, which is incorporated herein by reference in its entirety for all purposes.

BACKGROUND

1. Field

The present invention relates generally to electronic circuits, and more specifically to a direct downconversion receiver architecture for use in a wireless (e.g., CDMA) communication system.

2. Background

In a CDMA system, data to be transmitted is initially processed to generate a radio frequency (RF) modulated signal that is more suitable for transmission over a wireless communication channel. The RF modulated signal is then transmitted over the communication channel to one or more intended receivers, which may be terminals in the CDMA system. The transmitted signal is affected by various transmission phenomena, such as fading and multipath. These phenomena result in the RF modulated signal being received at the terminals at a wide range of signal power levels, which may be 100 dB or more.

At a given terminal, the transmitted signal is received, conditioned, and downconverted to baseband by a receiver front-end unit. Conventionally, the frequency downconversion from RF to baseband is performed with a heterodyne receiver that includes multiple (e.g., two) frequency downconversion stages. In the first stage, the received signal is downconverted from RF to an intermediate frequency (1F) where filtering and amplification are typically performed. And in the second stage, the IF signal is then downconverted from IF to baseband where additional processing is typically performed to recover the transmitted data.

The heterodyne receiver architecture provides several advantages. First, the IF frequency may be selected such that undesired inter-modulation (IM) products, which result from non-linearity in the RF and analog circuitry used to condition and downconvert the received signal, may be more easily filtered. Second, multiple filters and variable gain amplifier (VGA) stages may be provided at RF and IF to provide the necessary filtering and amplification for the received signal. For example, an RF amplifier may be designed to provide 40 dB of gain range and an IF amplifier may be designed to provide 60 dB of gain range, which would then collectively cover the 100 dB of dynamic range for the received signal.

For certain applications, such as cellular telephone, it is highly desirable to simplify the receiver design to reduce size and cost. Moreover, for mobile applications such as cellular telephone, it is highly desirable to reduce power consumption to extend battery life between recharges. For these applications, a direct downconversion receiver (which is also known as a homodyne receiver or a zero-IF receiver) may provide these desired benefits because it uses only one stage to directly downconvert the received signal from RF to baseband.

Several challenges are encountered in the design of a direct downconversion receiver. For example, because there is no IF signal in the direct downconversion receiver, the (e.g., 60 dB) gain range normally provided by the IF amplifier in the heterodyne receiver would need to be provided instead at either RF or baseband in the direct downconversion receiver. To avoid placing additional requirements on the RF circuitry and to reduce cost and circuit complexity, this IF gain range may be provided at baseband. However, if the baseband gain range is provided digitally after analog-to-digital conversion, then the baseband signal provided to the analog-to-digital converter (ADC) would have smaller amplitude since the gain is provided digitally after the ADC. DC offset in the baseband signal would then become a more critical consideration in the direct downconversion receiver because the baseband signal amplitude is smaller, and the DC offset may be a much larger percentage of the signal amplitude.

There is therefore a need in the art for a direct downconversion receiver architecture capable of providing the required signal gain and DC offset correction.

SUMMARY

Aspects of the invention provide a direct downconversion receiver architecture having a DC loop to remove DC offset from the signal components prior to and after the analog-to-digital conversion, a digital variable gain amplifier (DVGA) to provide a range of gains, an automatic gain control (AGC) loop to provide gain control for the RF/analog circuitry and the DVGA, and a serial bus interface (SBI) unit to provide controls for the RF/analog circuitry using a compact serial interface.

In an aspect, a DVGA is provided for use in the direct downconversion receiver. The DVGA can provide the required range of gains needed to account for all or a portion of the total dynamic range of the received signal (i.e., the portion not accounted for by the RF/analog circuitry). The design of the DVGA and the placement of the DVGA within the direct downconversion receiver architecture may be advantageously implemented as described herein.

In another aspect, the operating mode of the VGA loop is selected based in part on the operating mode of the DC loop. Since these two loops operate (directly or indirectly) on the same signal components, they interact with one another. Techniques are provided herein for a loop to signal an event that may impact the performance of the other loop, so that the other loop can appropriately handle the event to minimize performance degradation. For example, if the DC loop is operated in an acquisition mode to quickly remove large DC offsets, large DC spikes can be produced that may have various deleterious effects on the AGC loop, then this event is triggered and the AGC loop may then be operated in a low gain mode or frozen altogether to minimize the effects of the DC spikes on the operation of the AGC loop.

In yet another aspect, the duration of time the DC loop is operated in the acquisition mode is inversely proportional to the bandwidth of the DC loop in the acquisition mode. The DC loop bandwidth is designed to be wider in the acquisition mode to allow the DC loop to more quickly respond to and remove DC offset in the signal components. However, the wider loop bandwidth also results in more loop noise generated by the DC loop. To limit the amount of total noise (which includes the DC spike to be corrected and the loop noise) and still allow the DC loop to operate at high bandwidth, the time duration in which the DC loop operates in the acquisition mode may be set inversely proportional to the loop bandwidth. Since a wider loop bandwidth is able to more quickly correct for the DC offset, a shorter amount of time spent in the acquisition mode improves performance.

In yet another aspect of the invention, the controls for some or all of the RF/analog circuitry are provided via a serial bus. The use of a standard serial bus to control RF/analog functions provides many advantages, such as reduced pin count, simplified board layout, reduced cost, and so on. The serial bus may be designed with various features to more effectively provide the controls. For example, multiple hardware request channels may be supported (e.g., one channel for each circuit to be individually controlled), each channel may be associated with a respective priority, and messages may be transmitted on each channel using a number of possible data transfer modes.

Various aspects and embodiments of the invention are described in further detail below. The invention further provides methods, digital signal processors, receiver units, and other apparatuses and elements that implement various aspects, embodiments, and features of the invention, as described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

Figure 1:
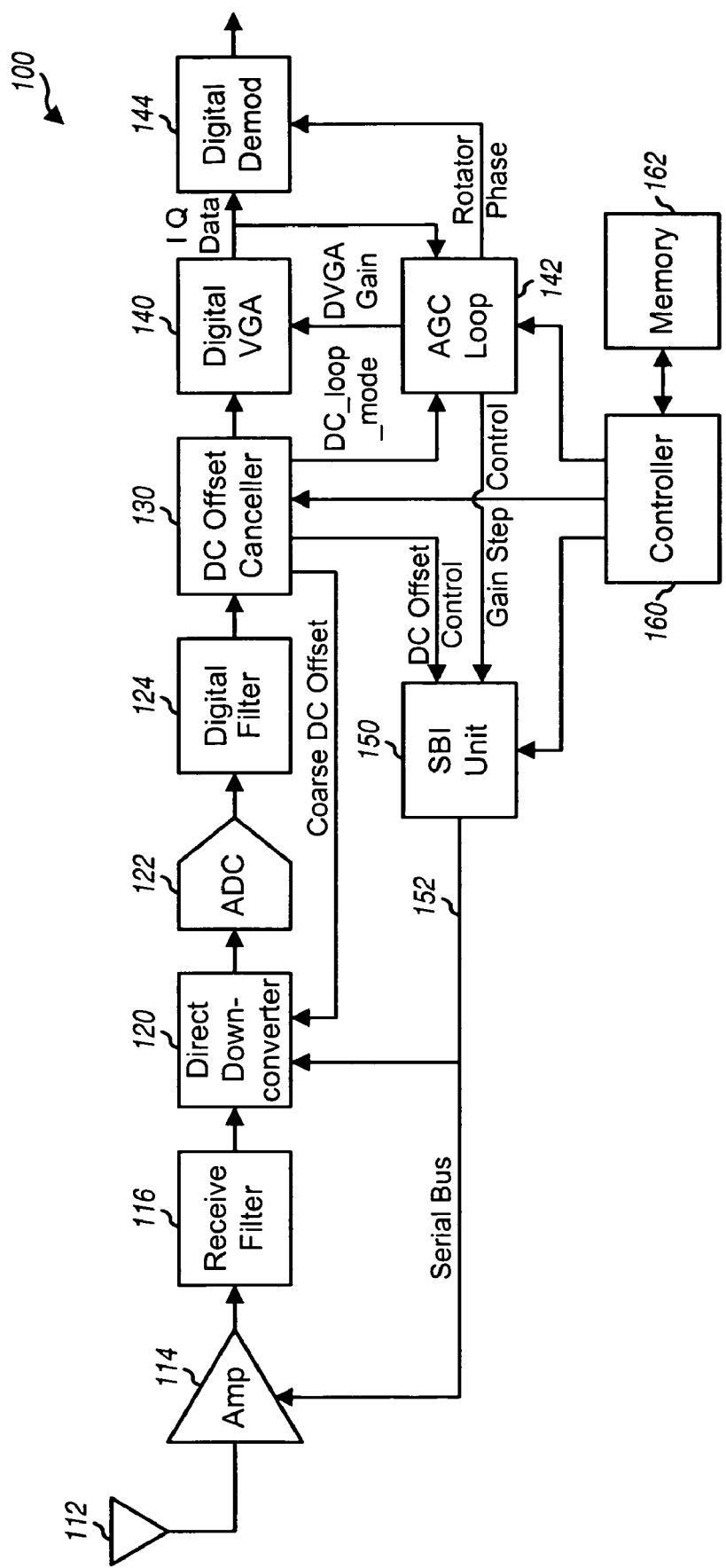
FIG. 1 is a block diagram of an embodiment of a receiver unit capable of implementing various aspects and embodiments of the invention.

FIG. 1 is a block diagram of an embodiment of a receiver unit 100 capable of implementing various aspects and embodiments of the invention. Receiver unit 100 may be implemented within a terminal or a base station of a wireless (e.g., CDMA) communication system. For clarity, various aspects and embodiments of the invention are described for a receiver implementation in a terminal. Also for clarity, specific design values are provided herein, but other design values may also be used and are within the scope of the invention.

In FIG. 1, one or more RF modulated signals transmitted from one or more transmitters (e.g., base stations, GPS satellites, broadcast stations, and so on) are received by an antenna 112 and provided to an amplifier (Amp) 114. Amplifier 114 amplifies the received signal with a particular gain to provide an amplified RF signal. Amplifier 114 may comprise one or more low noise amplifier (LNA) stages designed to provide a particular range of gains and/or attenuation (e.g., 40 dB from maximum gain to attenuation). The specific gain of amplifier 114 may be determined by a gain control message provided by a serial bus interface (SBI) unit 150 via a serial bus 152. The amplified RF signal is then filtered by a receive filter 116 to remove noise and spurious signals, and the filtered RF signal is provided to a direct downconverter 120.

Direct downconverter 120 performs direct quadrature downconversion of the filtered RF signal from RF to baseband. This may be achieved by multiplying (or mixing) the filtered RF signal with a complex local oscillator (LO) signal to provide a complex baseband signal. In particular, the filtered RF signal may be mixed with an inphase LO signal to provide an inphase (I) baseband component and mixed with a quadrature LO signal to provide a quadrature (Q) baseband component. The mixer used to perform the direct downconversion may be implemented with multiple stages that may be controlled to provide different gains, as described below. In this case, the specific gain to be provided by the mixer may also be determined by another gain control message provided by SBI unit 150 via serial bus 152, as shown in FIG. 1. The I and Q baseband components are then provided to one or more analog-to-digital converters (ADCs) 122.

ADCs 122 digitize the I and Q baseband components to provide I and Q samples, respectively. ADCs 122 may be implemented with various ADC designs, such as with sigma-delta modulators capable of filtering and then over-sampling the I and Q baseband components at multiple (e.g., 16) times the chip rate of the baseband components (which is 1.2288 Mcps for IS-95). The over-sampling allows the ADCs to provide a higher dynamic range and further allows the I and Q samples to be provided with fewer number of bits for a given precision. In a specific embodiment, ADCs 122 provide 2-bit I and Q samples at 16 times the chip rate (i.e., chip×16). Other types of ADCs may also be used and are within the scope of the invention. The I and Q samples are provided from ADCs 122 to a digital filter 124.

Digital filter 124 filters the I and Q samples to provide filtered I and Q samples, respectively. Digital filter 124 may perform any number of functions such as image rejection filtering, baseband pulse-matched filtering, decimation, sample rate conversion, and so on. In a specific embodiment, digital filter 124 provides 18-bit filtered I and Q samples at chip×8 to a DC offset canceller 130.

DC offset canceller 130 removes DC offset in the filtered I and Q samples to provide DC offset corrected I and Q samples, respectively. In a specific embodiment, DC offset canceller 130 implements two DC offset correction loops that attempt to remove DC offsets at two different locations in the received signal path—one at baseband after the frequency downconversion by direct downconverter 120 and another after the digital filtering by filter 124. The DC offset correction is described in further detail below.

A digital variable gain amplifier (DVGA) 140 then digitally amplifies the DC offset corrected I and Q samples to provide I and Q data for subsequent processing by a digital demodulator 144. In a specific embodiment, DVGA 140 provides 4-bit I and Q data at chip×8.

Digital demodulator 144 demodulates the I and Q data to provide demodulated data, which may then be provided to a subsequent decoder (not shown in FIG. 1). Demodulator 144 may be implemented as a rake receiver that can concurrently process multiple signal instances in the received signal. For CDMA, each finger of the rake receiver may be designed to (1) rotate the I and Q data with a complex sinusoidal signal to remove frequency offset in the I and Q data, (2) despread the rotated I and Q data with a complex pseudo-random noise (PN) sequence used at the transmitter, (3) decover the despread I and Q data with the channelization code (e.g., a Walsh code) used at the transmitter, and (4) data demodulate the decovered I and Q data with a pilot recovered from the received signal. Digital filter 124, DC offset canceller 130, DVGA 140, and digital demodulator 144 may be implemented within one or more integrated circuits (ICs), e.g., within a single digital signal processor.

An automatic gain control (AGC) loop unit 142 receives the I and Q data from DVGA 140 and a DC_loop_mode signal from DC offset canceller 130, and provides the gains for various variable gain elements within receiver unit 100. In an embodiment, the gains for amplifier 114 and direct downconverter 120 are provided to SBI unit 150, which then provides the appropriate gain control messages to these elements via serial bus 152. The gain for DVGA 140 is provided directly to the DVGA after taking into account the delay from the RF signal input to the input of the DVGA. AGC loop unit 142 provides the appropriate gains for amplifier 114, direct downconverter 120, and DVGA 140 such that the desired amplitude for the I and Q data is achieved. The AGC loop is described in further detail below.

A controller 160 directs various operations of receiver unit 100. For example, controller 160 may direct the operation of the DC offset cancellation, the AGC loop, the DVGA, the SBI, and so on. A memory 162 provides storage for data and program codes for controller 160.

In a typical receiver design, the conditioning of the received signal may be performed by one or more stages of amplifier, filter, mixer, and so on. For example, the received signal may be amplified by one or more LNA stages. Also, filtering may be provided before and/or after the LNA stages, and is also typically performed after the frequency downconversion. For simplicity, these various signal conditioning stages are lumped together into the blocks shown in FIG. 1. Other RF receiver designs may also be used and are within the scope of the invention. Amplifier 114, direct downconverter 120, and ADCs 122 form an RF front-end unit for the direct downconversion receiver.

The resolution of the I and Q samples at various signal processing blocks in FIG. 1 are provided for illustration. Different number of bits of resolution and different sample rates may also be used for the I and Q samples, and this is within the scope of the invention.

DC Offset Correction

Figure 2A:
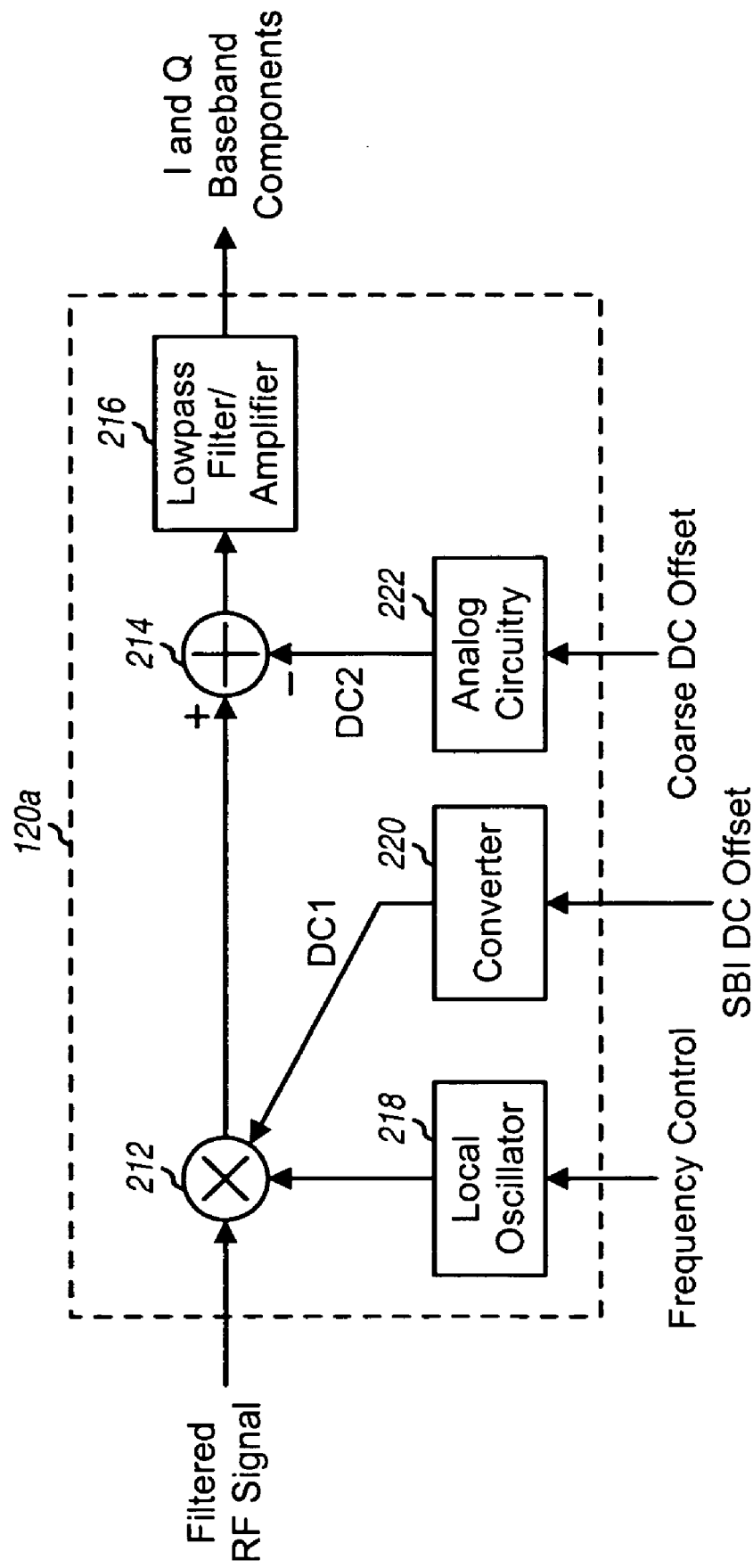
FIG. 2A is a block diagram of an embodiment of a direct downconverter.

FIG. 2A is a block diagram of a direct downconverter 120a, which is a specific embodiment of direct downconverter 120 in FIG. 1. Within direct downconverter 120a, the filtered RF signal from receive filter 116 is provided to a mixer 212, which also receives a (complex) LO signal from a local oscillator 218. The frequency of the LO signal may be controlled by a frequency control signal (which may be provided via serial bus 152 or some other signal lines) and is set to the center frequency of the RF modulated signal being recovered. Mixer 212 then performs quadrature downconversion of the filtered RF signal with the complex LO signal to provide inphase and quadrature components, which are then provided to a summer 214.

A converter 220 receives a digital DC offset control, which may be provided by DC offset canceller 130 via serial bus 152 and is denoted as SBI DC control in FIG. 2A. Converter 220 then performs digital-to-analog conversion of the digital control to generate DC offset control values of DC1I and DC1Q for the inphase and quadrature components, respectively. In an embodiment, these values are used to control the bias current of mixer 212 such that the DC offset in the signal components may be adjusted indirectly.

Analog circuitry 222 receives an analog DC offset control, which may be provided by DC offset canceller 130 via a dedicated signal line and denoted as coarse DC offset in FIG. 2A. Analog circuitry 222 then performs filtering and possibly level shifting and scaling to generate DC offset values of DC2I and DC2Q for the inphase and quadrature components, respectively. Summer 214 then subtracts the DC offset values of DC2I and DC2Q from the inphase and quadrature components, respectively. The output components from summer 214 are then filtered and amplified by a lowpass filter/amplifier 216 to provide the I and Q baseband components.

Figure 2B:
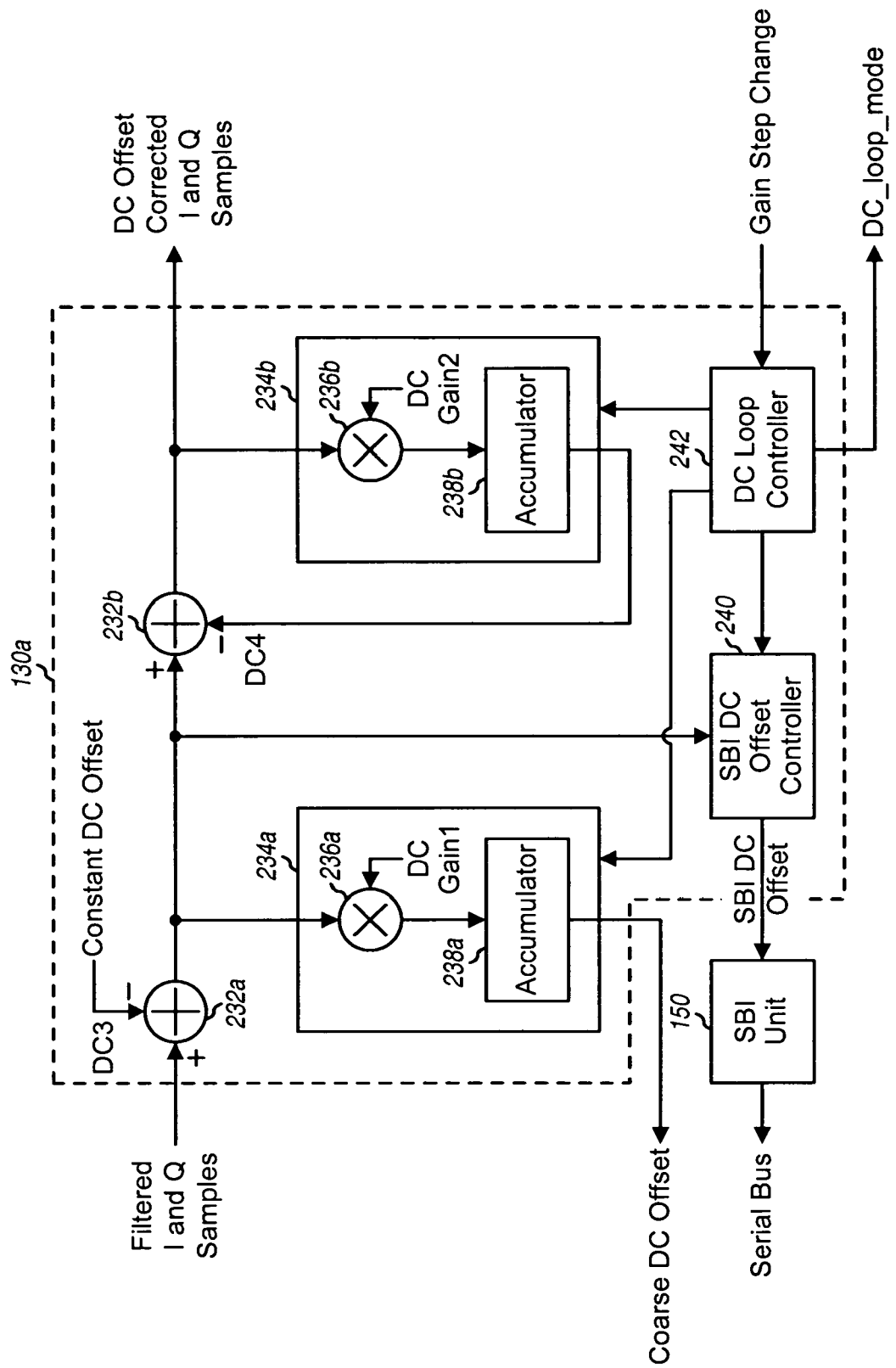
FIG. 2B is a block diagram of an embodiment of a DC offset canceller.

FIG. 2B is a block diagram of a DC offset canceller 130a, which is a specific embodiment of DC offset canceller 130 in FIG. 1. DC offset canceller 130a includes summers 232a and 232b, DC loop control units 234a and 234b, an SBI DC offset controller 240, and a DC loop controller 242. In an embodiment, the DC offset correction is performed separately for the I and Q samples. Thus, summers 232a and 232b and DC loop control units 234a and 234b each includes two elements, one to process the I samples and another to process the Q samples.

The filtered I and Q samples from digital filter 124 are provided to summer 232a, which removes fixed DC offset values of DC3I and DC3Q from the I and Q samples, respectively. Summer 232a may be used to remove DC offset that is static (e.g., caused by circuit mismatch and so on). The I and Q outputs from summer 232a are then provided to summer 232b, which further removes DC offset values of DC4I and DC4Q (which are provided by DC loop control unit 234b) from these I and Q outputs to provide the DC offset corrected I and Q samples.

DC loop control unit 234a receives the I and Q outputs from summer 232a, determines the DC offsets in these outputs, and provides the coarse DC control to analog circuitry 222 within direct downconverter 120a. DC loop control unit 234b similarly receives the I and Q outputs from summer 232b, determines the DC offsets in these outputs, and provides the DC offset values of DC4I and DC4Q to summer 234b. Each DC loop control unit 234 is implemented with a gain element 236 coupled to an accumulator 238. Gain element 236 multiplies the input I or Q sample with a particular gain (DC gain 1 for unit 234a and DC gain 2 for unit 234b) selected for that loop. Accumulator 238 then accumulates the scaled I or Q sample to provide the DC offset control for that loop.

Summer 214 within direct downconverter 120a and DC loop control unit 234a implement a coarse-grain DC loop that removes DC offset in the baseband components after the direct downconversion by mixer 212. Summer 232b and DC loop control unit 234b implement a fine-grain DC loop that removes DC offset that still remains after the coarse-grain DC loop. As their names imply, the fine-grain DC loop has higher resolution than the coarse-grain DC loop.

SBI DC offset controller 240 periodically determines the SBI DC offset control based on various factors such as temperature, the gains of amplifier 114 and mixer 212, time, drift, and so on. The SBI DC offset control is then provided via serial bus 152 to converter 220, which then generates the corresponding DC offset control values of DC1I and DC1Q for mixer 212.

An implementation of the DC offset correction for a direct downconversion receiver, such as the one shown in FIG. 1, is described in further detail in U.S. patent application Ser. No. 10/139,205, entitled "Direct Current Offset Cancellation for Mobile Station Modems Using Direct Downconversion," filed filed May 2, 2002, which is incorporated herein by reference.

The four sets of DC offset values (DC1I and DC1Q, DC2I and DC2Q, DC3I and DC3Q, and DC4I and DC4Q) represent four different mechanisms that may be used individually or in combination to provide the required DC offset correction for the direct downconversion receiver. The coarse-grain DC loop (which provides the values of DC2I and DC2Q) and the fine-grain DC loop (which provides the values of DC4I and DC4Q) may be operated to dynamically remove DC offset in the I and Q signal components. Summer 232a (which subtracts the values of DC3I and DC3Q) may be operated to remove static DC offset. And SBI DC offset controller 240 (which provides the values of DC1I and DC1Q) may be used to remove dynamic and/or static DC offset in the signal components.

In an embodiment, the coarse-grain and fine-grain DC loops each supports two operating modes—an acquisition mode and a tracking mode. The acquisition mode is used to more quickly remove large DC offset that may have been introduced in the signal components as a result of (1) a step change in the gains of the RF/analog circuitry such as amplifier 114 and/or mixer 212, or (2) the overall DC loop performing a periodic DC update, which may result in new values of DC1 and/or DC3 being provided to mixer 212 and/or summer 232a, or (3) or any other reasons, respectively. The tracking mode is used to perform the DC offset correction in a normal manner, and its response is slower than that of the acquisition mode. Different or additional operating modes may also be supported, and this is within the scope of the invention. The acquisition and tracking modes may correspond to two different DC loop gain values for DC gain 1 and to two different DC loop gain values for DC gain 2.

For simplicity, the coarse-grain and fine-grain DC loops are collectively referred to as simply the "DC loop". The DC_loop_mode control signal indicates the DC loop's current operating mode. For example, the DC_loop_mode control signal may be set to logic high to indicate that the DC loop is operating in the acquisition mode and to logic low to indicate that it is operating in the tracking mode.

Digital VGA

An aspect of the invention provides a DVGA for use in a direct downconversion receiver. The DVGA can provide the required range of gains needed to account for all or a portion of the total dynamic range for the received signal (i.e., the portion not accounted for by the RF/analog circuitry). The DVGA's gain range may thus be used to provide the gain previously provided at intermediate frequency (IF) in a heterodyne receiver. The design of the DVGA and the placement of the DVGA within the direct downconversion receiver architecture may be advantageously implemented as described below.

Figure 3:
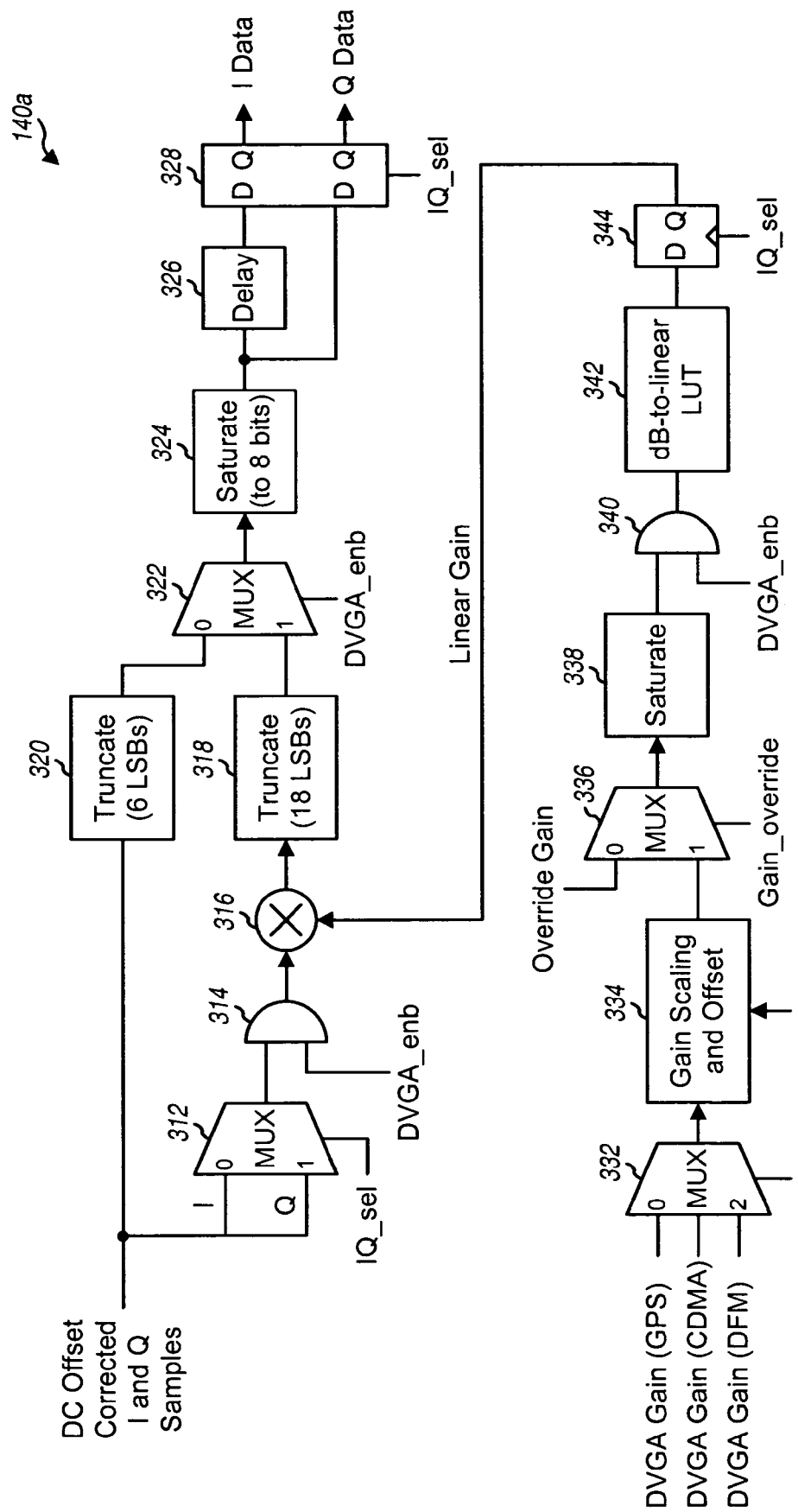
FIG. 3 is a block diagram of an embodiment of a digital variable gain amplifier (DVGA)

FIG. 3 is a block diagram of a DVGA 140a capable of providing digital baseband gain for I and Q samples. DVGA 140a is a specific embodiment of DVGA 140 in FIG. 1.

Within DVGA 140a, the DC offset corrected I and Q samples from the preceding DC offset canceller 130 are provided to a multiplexer (MUX) 312 and a truncation unit 320. To minimize hardware, only one digital multiplier 316 is used to perform the gain multiplication for both I and Q samples in a time division multiplexed (TDM) manner. Thus, multiplexer 312 alternately provides an I sample and then a Q sample (as determined by an IQ_sel control signal) to multiplier 316 via an AND gate 314. The IQ_sel control signal is simply a square wave at the I and Q sample rate (e.g., chip×8) and having the appropriate phase (e.g., logic low for the I samples). AND gate 314 performs an AND operation of the I or Q sample with a DVGA_enb control signal, which is set to logic high if the DVGA is enabled and set to logic low if the DVGA is bypassed. The DVGA may be bypassed, for example, if the DVGA's gain range is not needed or if the gain range is provided with analog circuitry (e.g., a variable gain amplifier). AND gate 314 thus passes the sample to multiplier 316 if the DVGA is enabled and provides a zero otherwise. The zero reduces power consumption by the subsequent circuitry by eliminating transitions that consume power in CMOS circuits.

Multiplier 316 multiplies the I or Q sample from AND gate 314 with a gain from a register 344 and provides the scaled (or amplified) sample to a truncation unit 318. In a specific embodiment, multiplier 316 is operated at twice the sample rate, which is chip×16 for I/Q sample rate of chip×8. In a specific embodiment, for CDMA and GPS, the input I and Q samples have 18 bits of resolution with 10 bits of resolution to the right of the binary point (i.e., 18Q10), the gain has 19 bits of resolution with 12 bits of resolution to the right of the binary point (i.e., 19Q12), and the scaled samples have 37 bits of resolution with 22 bits of resolution to the right of the binary point (i.e., 37Q22). In a specific embodiment, for digital FM or DFM, the input I and Q samples have a resolution of 18Q6, the gain has a resolution of 19Q12, and the scaled samples have a resolution of 37Q18. Truncation unit 318 truncates the (e.g., 18) least significant bits (LSBs) of each scaled sample and provides the truncated sample (which has a resolution of 18Q4 for CDMA/GPS and 18Q0 for DFM) to one input of a multiplexer 322.

For certain operating modes of the receiver, the digital scaling by DVGA 140a is not needed and the input I and Q samples may be passed to the DVGA's output without any scaling (after the appropriate processing to obtain the desired output data format). Truncation unit 320 truncates the (e.g., 6) LSBs of each input sample and provides the truncated sample to the other input of multiplexer 322. Truncation unit 320 ensures that the output I and Q data have the same resolution regardless of whether the DVGA is enabled or bypassed.

Multiplexer 322 then provides the truncated sample from either truncation unit 318 or 320 depending on whether the DVGA is enabled or bypassed, respectively, which is determined by the DVGA_enb control signal. The selected sample is then provided to a saturation unit 324, which saturates the sample to the desired output data format, e.g., a resolution of 8Q4 for CDMA/GPS and 8Q0 for DFM. The saturated sample is then provided to a delay element 326 and to one input of a register 328. Delay element 326 provides one-half sample period of delay to align the I and Q data (which have been skewed by one-half sample period to implement the time division multiplexing for multiplier 316) and provides the delayed I sample to the other input of register 328. Register 328 then provides the I and Q data, with the timing aligned to the IQ_sel control signal. For CDMA/GPS, the four most significant bits (MSBs) of the I and Q data (i.e., with a resolution of 4Q0) is sent to the next processing block. And for DFM, the I and Q data (i.e., with a resolution of 8Q0) is sent directly to an FM processing block.

Receiver unit 100 may be used for various applications such as to receive data from a CDMA system, a GPS system, a digital FM (DFM) system, and so on. Each such application may be associated with a respective received signal having some particular characteristics and requiring some particular gain. As shown in FIG. 3, the three different gains to be used for CDMA, GPS, and DFM are provided to a multiplexer 332. One of the gains is then selected based on a Mode_sel control signal. The selected gain is then provided to a gain scaling and offset unit 334, which also receives a gain offset.

Gain scaling and offset unit 334 scales the selected (CDMA, GPS, or DFM) gain with an appropriate scaling factor such that the desired gain resolution is achieved. For example, the CDMA gain may be provided with a fixed number of bits (e.g., 10 bits) that cover one of several possible gain ranges (e.g., 102.4 dB and 85.3 dB gain ranges for the 10-bit CDMA gain), depending on the particular mode used for CDMA. The scaling factor is then selected such that the scaled CDMA gain has the same gain resolution (e.g., 0.13 dB) regardless of the particular mode used for CDMA. Gain scaling and offset unit 334 further subtracts the gain offset from the scaled gain. The gain offset is determined based on a setpoint selected for ADCs 122, which in turn determines the average power of the I and Q baseband components provided to the ADCs. The gain offset may be a programmable value having the same resolution as the scaled gain, and may be provided by controller 160.

A multiplexer 336 receives the scaled and offsetted gain from unit 334 and an override gain and provides one of the gains (based on a Gain_override control signal) to a saturation unit 338. The override gain may be used instead of the gain from the VGA loop, if it is desired to bypass the VGA loop. Saturation unit 338 then saturates the received gain (e.g., to 9 bits) to limit the range of the saturated gain (e.g., to 68.13 dB of total gain range for 9 bits, with 0.133 dB of resolution for each bit). An AND gate 340 then performs an AND operation on the saturated gain with the DVGA_enb control signal, and passes the saturated gain to a dB-to-linear look-up table (LUT) 342 if the DVGA is enabled or a zero otherwise (again, to reduce power consumption by the subsequent circuitry).

In an embodiment, the AGC loop provides the gain value (e.g., the CDMA gain) in logarithm (dB) format. The dB gain value may be used to mimic the characteristics of RF/analog variable gain circuits, which typically have log (or log-like) transfer functions for gain versus control value. Secondly, the receive gain is used as an estimate for the required transmit power in a CDMA phone call and to report the receive power to the base station when requested. These estimations are traditionally done in dB given the wide dynamic range of the received signal. However, since a linear digital multiplier 316 is used to provide the baseband gain multiplication, the dB gain value is translated to a linear gain value. Look-up table 342 performs the dB-to-linear translation based on a formula, which may be expressed as:

$$Y(\text{linear}) = 1^{X/20}, \quad \text{Eq (1)}$$

where Y is the linear gain value from the look-up table and X is an attenuation value, which may be defined as:

$$X = -(Z(dB) + \text{offset}), \quad \text{Eq (2)}$$

where Z is the dB gain value provided to the look-up table and the offset in equation (2) may be used to compensate for the truncation performed in unit 334 (e.g., offset=0.067 dB for a 4-bit truncation). Other techniques for converting dB gain value to linear gain value may also be used, and this is within the scope of the invention. The linear gain value from LUT 342 is then clocked by register 344 to align the timing of the gain value with that of the I or Q sample provided to multiplier 316.

The AGC loop may also be designed to operate based on linear (instead of dB) gain values, and this is within the scope of the invention.

Referring back to FIG. 1, DVGA 140 is placed after DC offset canceller 130 and outside of the DC loop in direct downconversion receiver 100. This DVGA placement provides several advantages and further avoids several disadvantages. First, if the DVGA is placed within the DC loop, then any DC offset will be amplified by the gain of the DVGA, which would then exacerbate the degradation caused by the DC offset. Second, the loop gain of the DC loop would also include the gain of the DVGA, which varies depending on the received signal strength. Since this DC loop gain directly affects (or determines) the bandwidth of the DC loop, the DC loop bandwidth would then vary along with the gain of the DVGA, which is an undesirable effect. The DC loop bandwidth may be maintained approximately constant by dynamically changing the DC loop gain (i.e., DC gains 1 and 2 within DC loop units 234a and 234b) in an inverse manner to any change in the DVGA gain, so that the overall DC loop gain is maintained constant. However, this would further complicate the design of the DC offset correction mechanisms. Moreover, the residual DC offset is variable when referenced to the actual signal power.

By advantageously placing DVGA 140 after DC offset canceller 130 and outside of the DC loop, the DC offset correction by the DC loop may be decoupled from the signal gain scaling by the DVGA. Moreover, implementation of the DVGA in the digital domain after ADCs 122 further simplify the design of the RF/analog circuitry, which may lead to reduced cost for the direct downconversion receiver. Since the digital gain is provided after ADCs 122, the amplitude of the signal components provided to the ADCs could potentially be smaller, which would then require greater dynamic range for the analog-to-digital conversion process so that the ADC noise does not significantly degrade the SNR of the quantized I and Q samples. ADCs with high dynamic range may be provided by over-sampling sigma-delta modulators, as is known in the art.

Automatic Gain Control

Figure 4A:
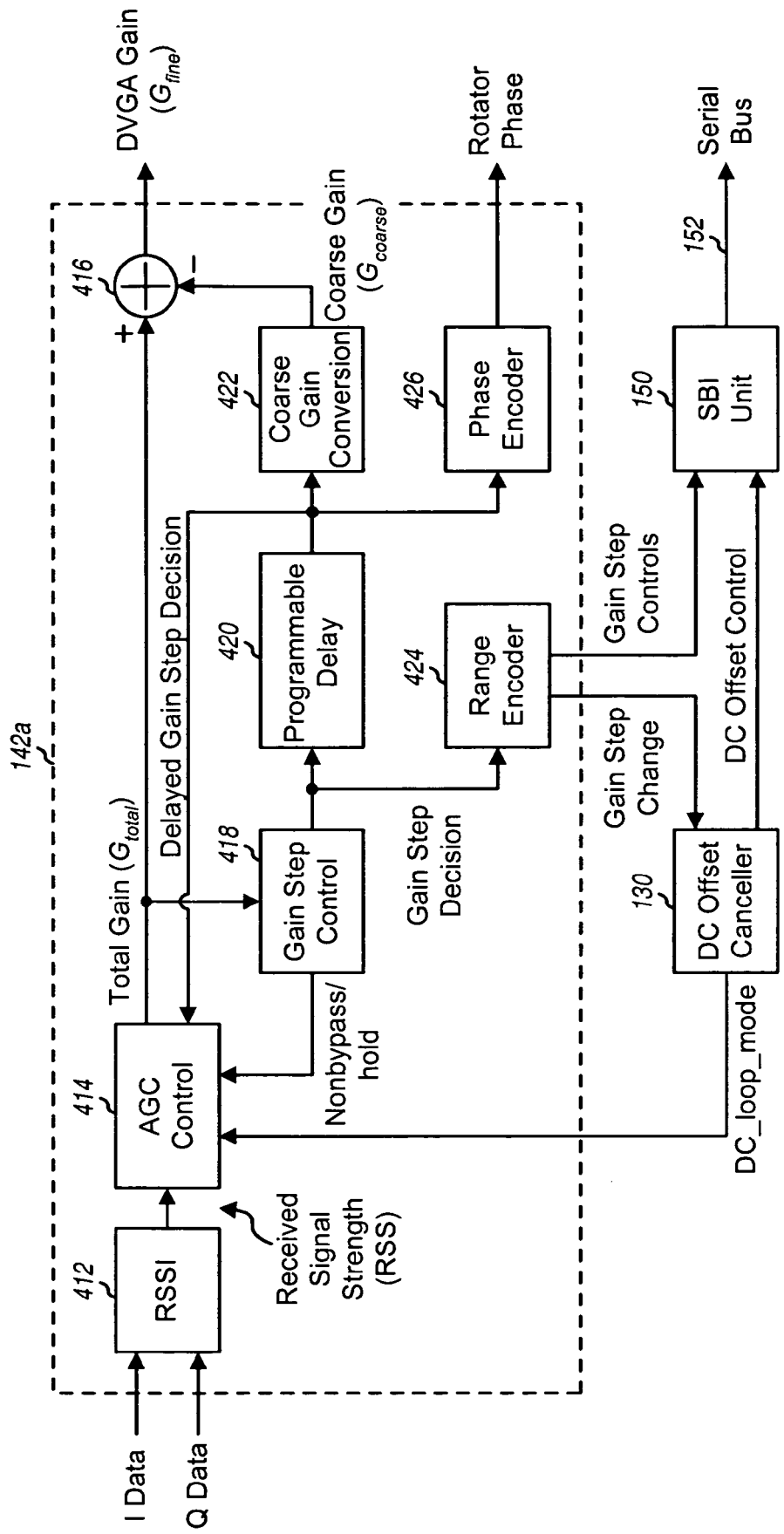
FIG. 4A is a block diagram of an AGC loop unit.

FIG. 4A is a block diagram of an AGC loop unit 142a, which is a specific embodiment of AGC loop unit 142 in FIG. 1. Within AGC loop unit 142a, the I and Q data is provided to a received signal strength indicator (RSSI) 412, which estimates the signal strength of the received signal. The received signal strength, RSS, may be estimated as follows:

$$RSS = \sum_{i}^{N_E} \{I^2(i) + Q^2(i)\}, \quad \text{Eq (3)}$$

where I(i) and Q(i) represent the I and Q data for the i-th sample period, and NE is the number of samples to be accumulated to derive the received signal strength estimate. Other techniques may also be used to estimate the received signal strength (e.g., $RSS = \Sigma|I_F(i)| + |Q_F(i)|$). The received signal strength estimate is then provided to an AGC control unit 414.

Figure 4B:
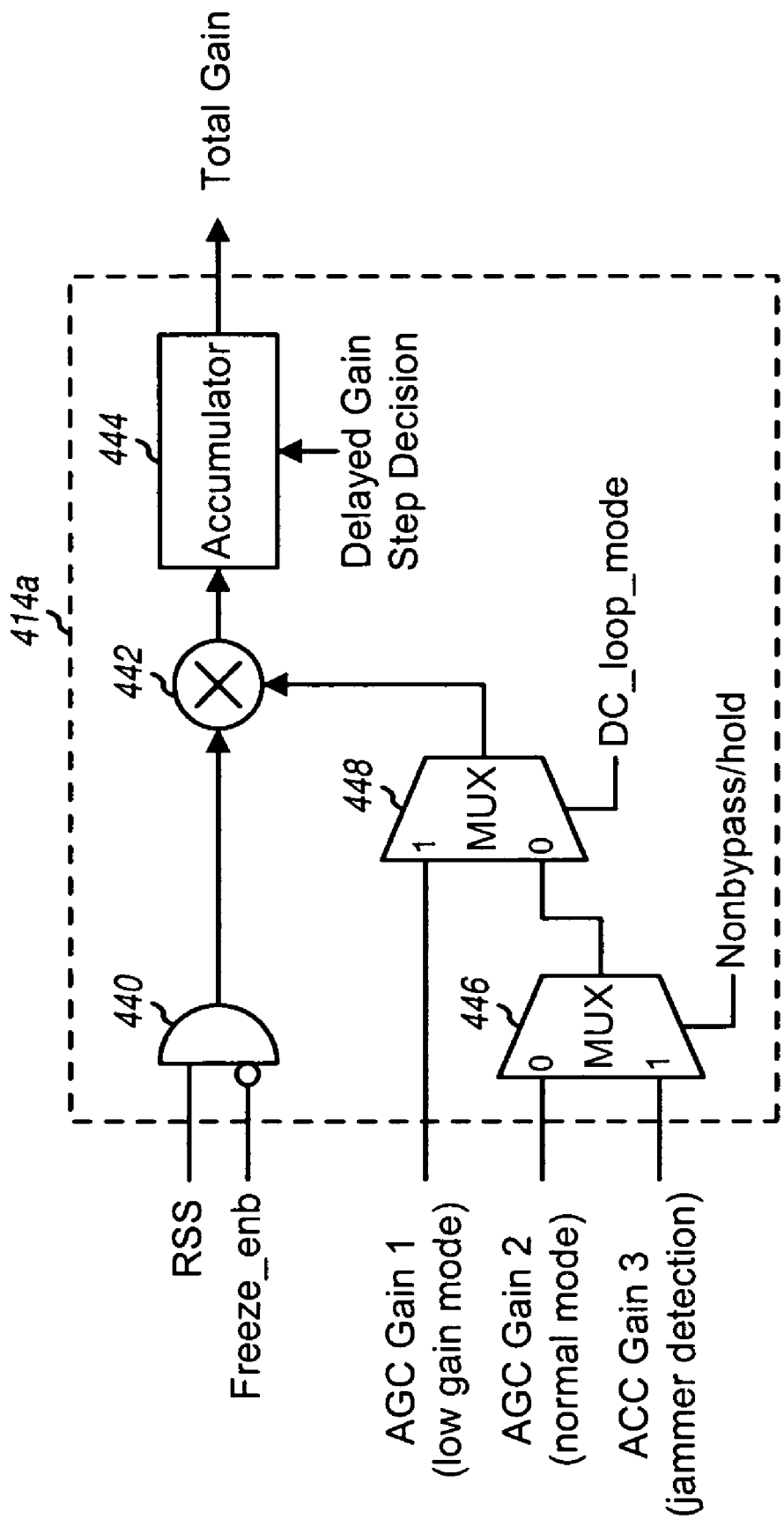
FIG. 4B is a block diagram of an AGC control unit.

FIG. 4B is a block diagram of an AGC control unit 414a, which is a specific embodiment of AGC control unit 414 in FIG. 4A. AGC control unit 414a receives the received signal strength estimate, RSS, from RSSI 412, the DC_loop mode control signal from DC offset canceller 130, a Nonbypass/hold control signal from gain step control unit 418, a delayed gain step decision from a programmable delay unit 420, and a Freeze_enb control signal (e.g., from controller 160), all of which are described in further detail below. Based on the received control signals and RSS, AGC control unit 414a provides an output gain value that is indicative of the total gain ($G_{total}$) to be applied to the received signal.

In an embodiment, the AGC loop supports three loop modes—a normal mode, a low gain mode, and a freeze mode. The normal mode is used to provide a nominal AGC loop bandwidth, the low gain mode is used to provide a smaller AGC loop bandwidth, and the freeze mode is used to freeze the AGC loop. The low gain and normal modes are associated with AGC loop gain values of AGC gain 1 and AGC gain 2, respectively. The freeze mode is achieved by zeroing out the value provided for accumulation by the AGC loop accumulator. In an embodiment, an additional AGC loop gain value of AGC gain 3 is used for jammer detection. AGC gain 3 is typically smaller than AGC gain 2 for the normal mode but larger than AGC gain 1 for the low gain mode, and is used to detect for the presence of jammer in the signal components, as described below. Different or additional modes may also be supported by the AGC loop, and this is within the scope of the invention.

As noted above, the DC loop affects the performance of the AGC loop. Thus, in an aspect, the specific AGC loop mode to use is dependent on (i.e., selected based on) the specific DC loop mode currently in use. In particular, the normal mode is used for the AGC loop when the DC loop is operated in the tracking mode, and the low gain or freeze mode is used for the AGC loop when the DC loop is operated in the acquisition mode.

As shown in FIG. 4B, the AGC gain 2 for the normal mode and the AGC gain 3 for jammer detection are provided to a multiplexer 446, which also receives the Nonbypass/hold control signal. The Nonbypass/hold control signal may be used to provide time hysteresis between gain steps (i.e., the AGC loop is maintained at a given gain step for a particular amount of time (Time 1 or Time 2) before it is allowed to switch to another (higher or lower) gain step.

Multiplexer 446 then provides the AGC gain 2 when the normal mode is selected, which is indicated by the Nonbypass/hold control being set to logic low. Alternatively, multiplexer 446 provides the AGC gain 3 when jammer detection is to be performed, which is indicated by the Nonbypass/hold control being set to logic high. A multiplexer 448 receives the AGC gain 1 for the low gain mode and the output from multiplexer 448 at its two inputs and further receives the DC_loop_mode control signal. Multiplexer 448 then provides the AGC gain 1 to a multiplier 442 when the low gain mode is selected for the AGC loop when the DC loop is in the acquisition mode, which is indicated by the DC_loop_mode control being set to logic high. Alternatively, multiplexer 448 provides the AGC gain 2 or AGC gain 3 to multiplier 442 during the tracking mode, which is indicated by the DC_loop_mode control being set to logic low.

An AND gate 440 receives the received signal strength estimate, RSS, and the Freeze_enb control. AND gate 440 then provides the RSS to multiplier 442 when (1) the DC loop is operated in the tracking mode or (2) the low gain mode is used for the AGC loop when the DC is operated in the acquisition mode. Alternatively, AND gate 440 provides a zero to multiplier 442 when the DC loop is operated in the acquisition mode and the AGC loop is frozen. The zero from AND gate 440 results in an accumulation of zero by AGC loop accumulator 444 when the AGC loop is frozen.

Multiplier 442 multiplies the received signal strength estimate, RSS, with the selected AGC gain from multiplexer 448 and provides the result to AGC loop accumulator 444. Accumulator 444 then accumulates the result with the stored value and provides an output gain value that is indicative of the total gain, $G_{total}$, to be applied to the received signal to achieve the desired signal level, which is determined by the gain offset provided to gain scaling and offset unit 334 in FIG. 3. This total gain may be decomposed into two parts—(1) a coarse gain, $G_{coarse}$, for the RF/analog circuitry (e.g., amplifier 114 and mixer 212) and (2) a fine gain, $G_{fine}$, for DVGA 140. The total gain for the received signal may thus be expressed as:

$$G_{total} = G_{coarse} + G_{fine}, \qquad \text{Eq (4)}$$

where $G_{total}$, $G_{coarse}$, and $G_{fine}$ are all given in dB.

As shown in FIG. 4B, accumulator 444 also receives the delayed gain step decision, which is indicative of the specific discrete gain to be used for the RF/analog circuits, as described below. Each discrete gain for the RF/analog circuits may be associated with a respective set of maximum and minimum values for the accumulation, which ensures stability in the AGC loop. For the specific discrete gain to be used, as indicated by the delayed gain step decision, the proper set of maximum and minimum values is used for the accumulation by accumulator 444.

Referring back to FIG. 4A, the coarse gain control for the RF/analog circuits is achieved by (1) mapping the total gain, $G_{total}$, into a gain step decision by a gain step control unit 418, (2) encoding the gain step decision into the appropriate gain step controls by a range encoder 424, (3) formatting the gain step controls into the proper messages by SBI unit 150, (4) sending the messages to the RF/analog circuits (e.g., amplifier 114 and/or mixer 212) via serial bus 152, and (5) adjusting the gains of the RF/analog circuits based on the messages. The fine gain control is achieved by (1) determining the fine gain, $G_{fine}$, for the DVGA by subtracting the coarse gain, $G_{coarse}$, from the total gain, $G_{total}$, and (2) adjusting the gain of the DVGA based on the fine gain. The derivation of the coarse and fine gains based on the total gain is described below.

Receiver unit 100 may be designed with amplifier 114 having multiple (e.g., four) stages and mixer 212 having multiple (e.g., two) stages. Each stage may be associated with a specific discrete gain. Depending on which stages are turned ON/OFF, different discrete gains may be achieved. The coarse gain then controls the gains of the RF/analog circuits in coarse discrete steps. The specific discrete gain to be used for the RF/analog circuits is dependent on the received signal level, the specific designs of these circuits, and so on.

Figure 4C:
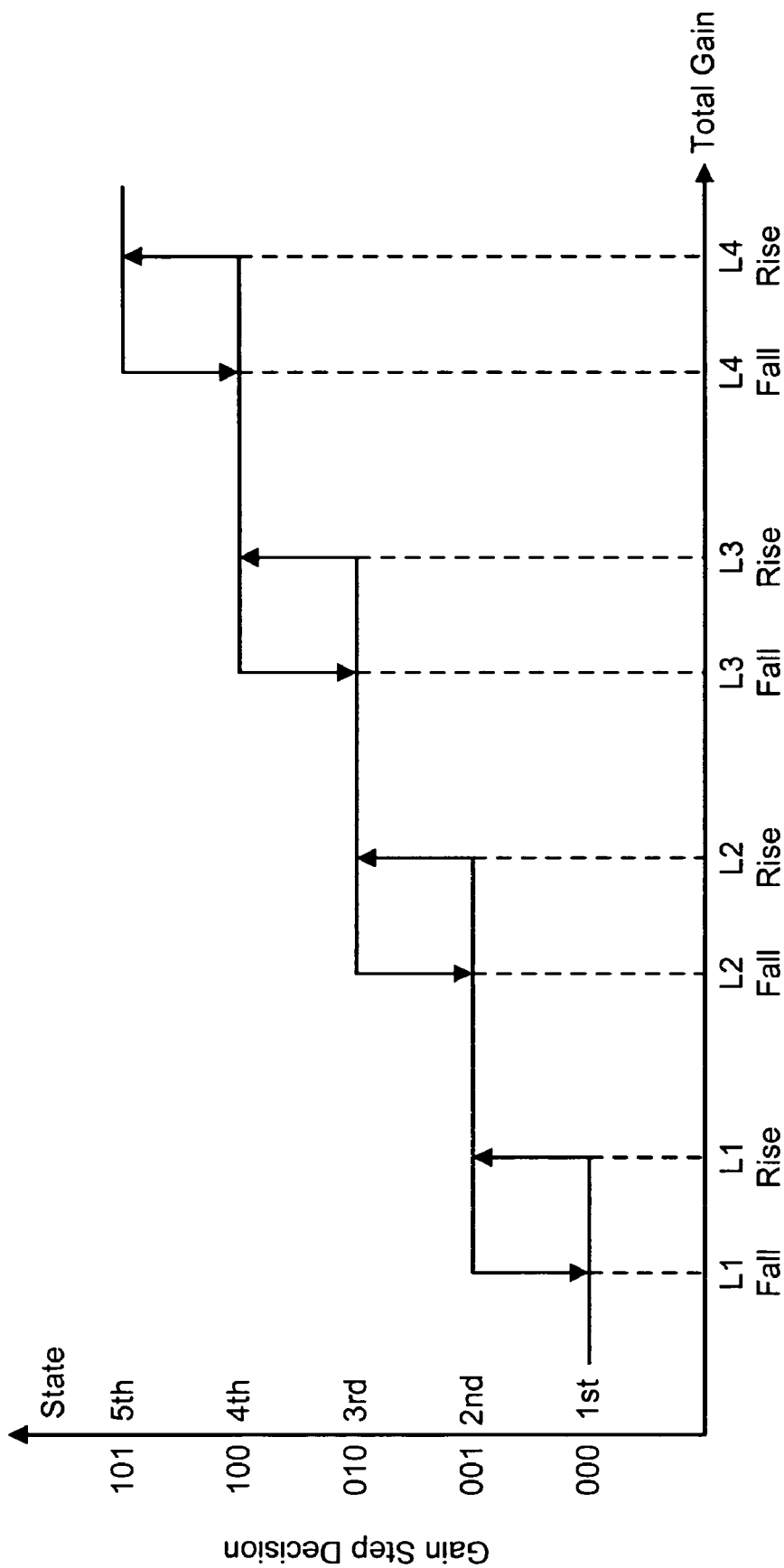
FIG. 4C is a diagram of an example gain transfer function for the RF/analog circuits.

FIG. 4C is a diagram of an example gain transfer function for the RF/analog circuits (e.g., amplifier 114 and mixer 212). The horizontal axis represents the total gain, which is inversely related to the received signal strength (i.e., higher gain corresponds to smaller received signal strength). The vertical axis represents the gain step decision provided by gain step control unit 418 based on the total gain. In this specific example design, the gain step decision takes on one of five possible values, which are defined in Table 1.

TABLE 1

| Gain Step Decision | RF/Analog Circuit State | Definition |
|---|---|---|
| 000 | first | lowest gain—all LNA stages are OFF; mixer is in low gain |
| 001 | second | second lowest gain—all LNA stages are OFF; mixer is in high gain |
| 010 | third | third highest gain—one LNA stage is ON; mixer is in high gain |
| 011 | fourth | second highest gain—two LNA stages are ON; mixer is in high gain |
| 100 | fifth | highest gain—all three LNA stages are ON, mixer is in high gain |

As shown in FIG. 4C, hysteresis is provided in the transition between adjacent states. For example, while in the second state ("001"), the first LNA is not turned ON (to transition to the third state "010") until the total gain exceeds the L2 Rise threshold, and this LNA is not turned OFF (to transition from the second back to the first state) until the total gain falls below the L2 Fall threshold. The hysteresis (L2 Rise-L2 Fall) prevents the LNA from being continually turned OFF and ON if the total gain is between or near the L2 Rise and L2 Fall thresholds.

Gain step control unit 418 determines the gain step decision based on the total gain, a transfer function such as the one shown in FIG. 4C (which is defined by the threshold values), and timing, jammer, and possibly other information. The gain step decision is indicative of the specific stages to be turned ON/OFF for amplifier 114 and mixer 212, as determined by the transfer function. Referring back to FIG. 4A, gain step control unit 418 then provides the gain step decision to programmable delay element 420 and range encoder 424.

In an embodiment and as shown in FIG. 1, the control to turn ON or OFF each stage of amplifier 114 and mixer 212 is provided to these circuits via serial bus 152. Range encoder 424 receives the gain step decision and provides the corresponding gain step control for each specific circuit to be controlled (e.g., one gain step control for amplifier 114 and another gain step control for mixer 212). The mapping between the gain step decision and gain step controls may be based on a look-up table and/or logic. Each gain step control comprises one or more bits and turns ON/OFF the designated stages within the circuit to be controlled by that gain step control. For example, amplifier 114 may be designed with four stages, and its (2-bit) gain step control may be associated with four possible values ("00", "01", "10", and "11") for the four possible discrete gains for the amplifier. Mixer 212 may be designed with two stages, and its (1-bit) gain step control may be associated with two possible values ("0" and "1") for the two possible discrete gains for the mixer. The gain step controls for amplifier 114 and mixer 212 are formatted into the proper messages by SBI unit 150, and these messages are then sent to the circuits via serial bus 152. Range encoder 424 also provides to DC offset canceller 130 a gain step change signal that indicates whether or not the gain of the RF/analog circuitry has changed to a new value or step.

As noted above, the total gain, $G_{total}$, for the received signal may be decomposed into the coarse gain, $G_{coarse}$, and the fine gain, $G_{fine}$. Moreover, as shown in FIG. 4A, the fine gain is generated by subtracting the coarse gain from the total gain by a summer 416. Since the coarse gain (in the form of the gain step controls) is provided to amplifier 114 and mixer 212 via SBI unit 150 and the serial bus, a delay is introduced between the time the coarse gain is determined by gain step control unit 418 and the time the coarse gain is actually applied by the RF/analog circuits. Moreover, processing delay is encountered by the received signal from the RF circuitry to the DVGA (e.g., especially digital filter 124). Thus, to ensure that the coarse gain is applied by the RF circuits and removed from the DVGA at the same time (i.e., so that the coarse gain is applied only once to any given data sample), a programmable delay is used to delay the coarse gain (as indicated by the gain step decision) before it is applied to DVGA 140.

Programmable delay element 420 provides a particular amount of delay for the gain step decision. This delay compensates for the delay introduced by SBI unit 150 and the delay of the received signal processing path from the RF circuitry to the DVGA. This delay may be programmed by writing a delay value to a register. Delay element 420 then provides the delayed gain step decision.

A coarse gain conversion unit 422 receives the delayed gain step decision, which is indicative of a specific discrete gain for the RF/analog circuits, and provides the corresponding coarse gain, $G_{coarse}$, having the proper range and resolution (e.g., the same range and resolution as for the total gain from AGC control unit 414). The coarse gain is thus equivalent to the gain step decision but is provided in a different format (i.e., the coarse gain is a high-resolution value whereas the gain step decision is a digital (ON/OFF) control). The gain step decision to coarse gain translation may be achieved with a look-up table and/or logic. The coarse gain is then subtracted from the total gain by summer 416 to provide the fine gain for the DVGA.

Whenever the gain of the RF/analog circuitry is changed by a coarse amount by switching stages ON and OFF, the phase of the signal components typically rotates by some particular step amount. The amount of phase rotation is dependent on which stages having been switched ON and OFF (as determined by the gain step decision) but is typically a fixed value for that particular setting or configuration. This phase rotation may result in degradation in the data demodulation process, until a frequency control loop is able to correct for the phase rotation.

In an embodiment, the gain step decision is mapped to a corresponding rotator phase, which is indicative of the amount of phase rotation in the received signal components due to the gain indicated by the gain step decision. The rotator phase is then provided to a rotator within digital demodulator 144 and used to adjust the phase of the I and Q data to account for the phase rotation introduced by the enabled gain stages in the RF/analog circuits. The mapping between gain step decision and rotator phase may be achieved with a look-up table and/or logic. Moreover, fine resolution may be achieved for the rotator phase (e.g., 5.6° resolution may be achieved with 6 bits for the rotator phase).

DC and AGC Loops Operation

As shown in FIG. 1, the DC loop operates on the filtered I and Q samples from digital filter 124 to remove DC offset, and the AGC loop (via DVGA 140) then operates on the DC offset corrected I and Q samples to provide the I and Q data that is then provided to digital demodulator 144. The AGC loop also controls the gain of the RF/analog circuitry, which in turn affects the amplitude of the I and Q samples operated on by the DC loop. The DC loop may thus be viewed as being embedded within the AGC loop. The operation of the DC loop affects the operation of the AGC loop.

In a direct downconversion receiver, DC offset (both static and time-varying) has more impact on the signal components because of the smaller signal amplitude. Large DC offsets (or DC spikes) may be introduced in the signal components by various means. First, when the gain of the RF/analog circuitry (e.g., amplifier 114 and mixer 212) is changed in discrete steps by switching ON/OFF stages, large DC offsets may be introduced in the signal components due to mismatch in the different stages being switched ON/OFF. Second, large DC offsets may also be introduced when the DC loop performs DC offset updates whereby different DC offset values of DC3I and DC3Q are provided to summer 232a and/or different DC offset values of DC1Q and DC1Q are provided to mixer 212 via the serial bus.

Large DC offsets may be removed using various mechanisms of the DC loop (e.g., the coarse-grain and fine-grain loop DC loops). Moreover, large DC offsets may be more quickly removed by operating the DC loop in the acquisition mode. However, until they are removed, the large DC offsets have deleterious effects on the signal components and may degrade performance.

First, any unremoved DC offset in the signal components appears as noise (whose power is equal to the DC offset) after the despreading operation by digital demodulator 144. This noise can degrade performance.

Second, a large DC offset disrupts the performance of the AGC loop in several ways. The DC offset adds to the signal components and results in combined (DC offset and signal) components having a larger amplitude. This then causes the AGC loop to reduce the total gain such that the power of the combined components is maintained at the AGC setpoint (e.g., $I^2+Q^2$=AGC setpoint). The reduced gain then causes compression of the desired signal components, with the amount of compression being proportional to the magnitude of the DC offset. The smaller amplitude for the desired signal components results in a degraded signal-to-quantization-noise ratio ($SNR_Q$), which also degrades performance. Moreover, if the DC loop is not able to completely remove the large DC offset before the it enters the tracking mode, then the residual DC offset would be removed more slowly in the tracking mode. The AGC loop would then follow this slow transient response of the DC loop, which then results in a prolonged degradation period until the DC and AGC loops both achieve steady state.

Third, a large DC offset affects the ability to accurately detect jammers, which are interfering signals in the desired signal band. A jammer may be generated by non-linearity in the circuits in the received signal path. Since non-linearity in amplifier 114 and mixer 212 are more pronounced when these circuits are operated at high gains (i.e., more stages being turned ON), the receiver may detect for jammers right after any of these circuits is switched to high gain. Jammer detection may be performed by measuring the power of the signal components with RSSI 412 right after the switch to a high gain, comparing the measured power against a threshold after a particular measurement time period, and declaring the presence of a jammer in the signal components if the measured power exceeds the threshold. If a jammer is detected, then the gain of one or more circuits may be reduced to either remove or mitigate the jammer. However, in the presence of DC offset introduced by the switch to the high gain, it may not be possible to discern whether the increase in the measured power is due to jammer or to the total noise, which includes any unremoved DC offset and the increased DC loop noise generated by operating the DC loop in the acquisition mode to quickly remove the DC offset. Thus, the presence of DC offset may impact the ability to accurately detect for jammers, which may degrade performance if the RF/analog circuits are operated at the wrong gains due to erroneous detection of jammers.

A large DC offset may cause long bursts of errors due to various deleterious effects described above. The degradation due to DC offset is more problematic at higher data rates since the time needed to remove DC spikes may be fixed (e.g., by the specific design of the DC loop), which then results in more errors at higher data rates.

In accordance with another aspect of the invention, the duration of time the DC loop is operated in the acquisition mode is inversely proportional to the bandwidth of the DC loop in the acquisition mode. The DC loop bandwidth is designed to be wider in the acquisition mode to allow the DC loop to more quickly respond to and remove DC offset. Increasingly wider loop bandwidth corresponds to increasingly faster loop response. As noted above, DC error in the desired signal components manifests as noise after the despreading operation within digital demodulator 144. This noise should be removed as quickly as possible, which may be achieved by increasing the bandwidth of the DC loop for the acquisition mode. However, the wider DC loop bandwidth also results in increased DC loop noise that may also degrade performance.

To maximize performance, the acquisition mode should trade off between the (introduced) DC offset to be corrected and the (self-generated) DC loop noise. To limit the amount of DC loop noise and still allow the DC loop to operate at high bandwidth, the time duration in which the DC loop is operated in the acquisition mode may be set inversely proportional to the loop bandwidth. A wider DC loop bandwidth generally corresponds to a shorter DC offset acquisition time due to the wider loop's ability to more quickly respond. Thus, the shorter amount of time spent in the acquisition mode with the wider DC loop bandwidth takes advantage of this fact, and the DC loop is not operated in the acquisition mode for longer than necessary, which may then improve performance.

The specific time duration to operate the DC loop in the acquisition mode may also be selected based on various other factors such as, for example, the expected amplitude of the DC offset, the amplitude of the DC loop noise, the modulation schemes, the bandwidth of the received signal, and so on. In general, the acquisition mode duration is inversely related to the DC loop bandwidth in the acquisition mode, with the exact function being dependent on the factors noted above.

In accordance with yet another aspect of the invention, the operation of the AGC loop is made dependent on the DC loop's operating mode. As noted above, any un-removed DC offset, which is typically larger when the DC loop changes into acquisition mode, affects the operation of the AGC loop. Thus, DC offset canceller 130 provides to AGC loop unit 142 the DC_loop_mode control signal, which indicates the DC loop's current operating mode. When the DC loop is switched to the acquisition mode to quickly remove a (potentially) large DC offset, the AGC loop may simultaneously be switched to either the low gain mode or the freeze mode so that the AGC loop responds slowly or not at all to the DC offset while the DC loop is in the acquisition mode. The AGC loop may then be switched back to the normal mode after the DC loop transitions to the tracking mode.

The small or zero AGC gain used while the DC loop is in the acquisition mode ensures that the AGC loop preserves its control signals during the DC acquisition period. The AGC control signals will then be ready to operate in the normal manner once the DC loop enters the tracking mode. The small or zero AGC gain also hinders or prevents the AGC loop from moving the power of the desired signal components from the AGC setpoint, and further reduces the impact of the DC offset in the jammer detection process, which would then reduce the likelihood of erroneous jammer detection.

The specific normal and small AGC gains to be used may be determined by simulation, empirical measurement, or some other means. These gains may also be programmable (e.g., by controller 160).

Serial Bus Interface (SBI)

In accordance with yet another aspect of the invention, the controls for some or all of the RF/analog circuits are provided via serial bus 152. The use of a standard serial bus to control RF/analog functions provides many advantages, as described below. Moreover, the serial bus may be designed with various features to more effectively provide the required controls, as also described below.

Conventionally, controls for RF/analog circuits (e.g., amplifier 114 and mixer 212) are provided using dedicated signals between the circuits to be controlled and the controller providing the controls. One or more pins may be designated on the controller for each circuit to be individually controlled. For example, three pins may be designated on the controller and the RF/analog chip to control the five stages of the amplifier/mixer described above. The use of designated pins for specific functions increases pin count and complicates board layout, which may lead to increased cost for the receiver.

The use of a serial bus to provide controls for RF/analog circuits can ameliorate many of the disadvantages encountered in the conventional design and can further provide additional benefits. First, the serial bus can be implemented with few pins (e.g., two or three) and these same pins can be used to provide control for multiple circuits implemented in one or more integrated circuits (ICs). For example, a single serial bus may be used to control the gain of amplifier 114, the gain of mixer 212, the DC offset of mixer 212, the frequency of oscillator 218, and so on. By reducing the number of required pins to interconnect the RF/analog IC with the controller, the costs of the RF/analog IC, the controller, and the circuit board may all be reduced. Second, the use of a standard serial bus increases flexibility for future chip sets since it standardizes the hardware interface between the RF/analog IC and the controller. This also allows a manufacturer to use the same board layout with different RF/analog ICs and/or controllers without altering or increasing the number of required control lines.

In an embodiment, SBI unit 150 is designed to support a number of hardware request (HWREQ) channels, each of which may be used to support a particular function. For example, one channel may be used for the VGA loop to set the step gains of amplifier 114 and mixer 212, and another channel may be used for the DC loop to set the DC offset control value (DC1) for mixer 212. In general, the SBI unit may be designed to support any number of hardware request channels.

Each circuit to be separately controlled may be associated with a respective address. Each message transmitted via the SBI unit includes the address of the circuit for which the message is transmitted. Each circuit coupled to the serial bus would then examine the address included in each transmitted message to determine whether or not the message is intended for that circuit, and would only process the message if it is addressed to that circuit.

In an embodiment, each hardware request channel may be designed with the ability to support a number of data transfer modes, which may include a fast transfer mode (FTM), an interrupt transfer mode (ITM), and a burst or bulk transfer mode (BTM). The fast transfer mode may be used to transmit multiple bytes to multiple circuits in accordance with the following the pattern: ID, ADDR, DATA, ADDR, DATA, . . . where ID is the hardware request channel ID, ADDR is the address of the recipient circuit, and DATA is the data for the recipient circuit. The interrupt transfer mode may be used to transmit a single byte for broadcasting to one or more circuits coupled to the serial bus. And the burst transfer mode may be used to transmit multiple bytes to a specific circuit in accordance with the following the pattern: ID, ADDR, DATA1, DATA2 . . . . Different and/or additional transfer modes may also be implemented, and this is within the scope of the invention.

In an embodiment, the hardware request channels may be assigned specific priorities (e.g., by the controller). The priorities of the channels may be programmed into a register within SBI unit 150. The channels' priorities would then determine the order in which messages are sent, if multiple messages need to be sent by the SBI unit over the serial bus. A higher priority may be assigned to a channel used for a control loop requiring fast response (e.g., the gain step for amplifier 114 and mixer 212) and a lower priority may be assigned to a channel used for more static functions (e.g., the receive mode of direct downconverter 120, e.g., DFM and GPS).

Each hardware request channel may also be associated with a respective enable flag that indicates whether or not that channel is enabled for use. The enable flags for all channels may be maintained by SBI unit 150.

In an embodiment, the serial bus comprises three signals—a data signal, a clock signal, and a strobe signal. The data signal is used to send the messages. The clock signal is provided by the sender (e.g., the controller) and used by the receivers to latch the data provided on the data signal. And the strobe signal is used to indicate the start/stop of messages. Different serial bus designs with different signals and/or different number of signals may also be implemented, and this is within the scope of the invention.

The various aspects and embodiments of the direct downconversion receiver described herein may be implemented in various wireless communication systems, such as CDMA systems, GPS systems, digital FM (DFM) systems, and so on. The direct downconversion receiver may also be used for the forward link or the reverse link in these communication systems.

The various aspects and embodiments of the direct downconversion receiver described herein may be implemented by various means. For example, all or some portions of the direct downconversion receiver may be implemented in hardware, software, or a combination thereof. For a hardware implementation, the DVGA, DC offset correction, gain control, SBI, and so on may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

For a software implementation, the elements used for gain control and/or DC offset correction may be implemented with modules (e.g., procedures, functions, and so on) that perform the functions described herein. The software codes may be stored in a memory unit (e.g., memory 162 in FIG. 1) and executed by a processor (e.g., controller 160). The memory unit may be implemented within the processor or external to the processor, in which case it can be communicatively coupled to the processor via various means as is known in the art.

Headings are included herein for reference and to aid in locating certain sections. These headings are not intended to limit the scope of the concepts described therein under, and these concepts may have applicability in other sections throughout the entire specification.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of controlling one or more analog circuits in receiver via a serial bus, comprising:
   receiving a control for a particular analog circuit;
   forming a message corresponding to the received control;
   sending the message over the serial bus;
   receiving the message at the particular analog circuit; and
   adjusting one or more characteristics of the particular analog circuit based on the received message;
   wherein:
      each of the one or more analog circuits is assigned a respective priority;
      messages are sent to the one or more analog circuits based in part on their assigned priorities;
      messages are sent to the one or more analog circuits via a plurality of data transfer modes, including a fast transfer mode and an interrupt transfer mode; and
      the interrupt transfer mode is used to send messages to analogs circuits with relatively higher respective priorities.

2. An apparatus for controlling one or more analog circuits in receiver via a serial bus, comprising:
   means for receiving a control for a particular analog circuit;
   means far forming a message corresponding to the received control:
   means for sending the message over the serial bus;
   means for receiving the message at the particular analog circuit; and
   means for adjusting one or more characteristics of the particular analog circuit based on the received message;
   wherein:
      each of the one or more analog circuits is assigned a respective priority;
      messages are sent to the one or more analog circuits based in part on their assigned priorities;
      messages are sent to the one or more analog circuits via a plurality of data transfer modes, including a fist transfer mode and an interrupt transfer mode; and
      the interrupt transfer mode is used to send messages to analog circuits with relatively higher respective priorities.

3. A receiver unit comprising:
   an RF front-end unit operative to amplify, downconvert, and digitize a received signal to provide samples;
   a digital signal processor operative to process the samples to provide output data; and
   a serial bus interface (SBI) unit operative to provide controls for the RF front-end unit via a serial bus for adjusting one or more characteristics of the front end circuit based on the received signal;
   wherein the SBI unit is configured to support a plurality of hardware request channels, each hardware request channel is associated with a respective priority, each hardware request channel is openable to send messages via a plurality of possible data transfer modes, the plurality of possible data transfer modes include a fast transfer mode and an interrupt transfer mode, and the interrupt transfer mode is used with one or more channels with relatively higher respective priorities.

* * * * *